(12) United States Patent
Terada et al.

(10) Patent No.: US 6,492,666 B2
(45) Date of Patent: Dec. 10, 2002

(54) SEMICONDUCTOR WAFER WITH SCRIBE LINES HAVING INSPECTION PADS FORMED THEREON

(75) Inventors: Yukihiro Terada, Kanagawa (JP); Kenichi Miki, Kanagawa (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/906,079

(22) Filed: Jul. 17, 2001

(65) Prior Publication Data

US 2002/0084512 A1 Jul. 4, 2002

(30) Foreign Application Priority Data

Jul. 17, 2000 (JP) ........................................ 2000-215746

(51) Int. Cl.[7] .............................................. H01L 27/10
(52) U.S. Cl. ........................ 257/202; 257/209; 257/211
(58) Field of Search .............................. 438/14, 13, 15, 438/16, 17, 113, 118, 464; 324/750, 763; 257/48, 202, 211, 355, 252

(56) References Cited

U.S. PATENT DOCUMENTS

| | | | | |
|---|---|---|---|---|
| 4,562,640 A | * | 1/1986 | Widmann et al. | 29/591 |
| 4,903,111 A | * | 2/1990 | Takemae et al. | 257/209 |
| 4,965,218 A | * | 10/1990 | Geissberger et al. | 438/182 |
| 5,366,906 A | * | 11/1994 | Wojnarowski et al. | 438/17 |
| 5,412,337 A | * | 5/1995 | Kumakura | 327/427 |
| 5,523,252 A | * | 6/1996 | Saito | 324/765 |
| 5,641,714 A | * | 6/1997 | Yamanaka | 438/14 |
| 5,990,691 A | * | 11/1999 | Joerg et al. | 324/750 |
| 6,031,257 A | * | 2/2000 | Noto et al. | 257/202 |
| 6,057,170 A | * | 5/2000 | Witte | 438/14 |
| 6,124,917 A | * | 9/2000 | Fujioka et al. | 349/138 |
| 6,228,684 B1 | * | 5/2001 | Maruyama | 438/113 |
| 6,262,541 B1 | * | 7/2001 | Asai | 315/169.4 |
| 6,288,765 B1 | * | 9/2001 | Tanaka et al. | 349/153 |
| 6,395,568 B1 | * | 5/2002 | Blish et al. | 257/252 |

FOREIGN PATENT DOCUMENTS

| | | | | |
|---|---|---|---|---|
| JP | 07146323 | * | 6/1995 | G01R/31/02 |
| JP | 10197891 | * | 7/1998 | G02F/1/1345 |
| JP | 11-243120 | | 9/1999 | |
| JP | 2002033361 | * | 1/2002 | H01L/21/66 |

* cited by examiner

Primary Examiner—Chandra Chaudhari
Assistant Examiner—Laura M Schillinger
(74) Attorney, Agent, or Firm—Whitham, Curtis & Christofferson, P.C.

(57) ABSTRACT

A plurality of IC chips each having an internal circuit are mounted on a wafer substrate. A plurality of scribe lines are formed on the wafer substrate for separating the IC chips from one another. A plurality of inspection pads are formed on the scribe lines. Each of the inspection pads is connected to the associated internal circuit via a conduction path for inspecting an operation of the associated IC chip.

10 Claims, 3 Drawing Sheets

SEMICONDUCTOR WAFER WITH SCRIBE LINES HAVING INSPECTION PADS FORMED THEREON

BACKGROUND OF THE INVENTION

The present invention relates to a semiconductor wafer, and more particularly to a semiconductor wafer on which a plurality of IC chips isolated by scribe lines from one another and a plurality of inspection pads are formed.

Inspection pads for inspecting operations of IC chips formed on a semiconductor wafer are sometimes formed in the IC chips, respectively. FIG. 4 shows a part of a semiconductor wafer on which IC chips each having such an inspection pad are formed. Plural IC chips 42 are formed on the semiconductor wafer 41, and isolated by scribe lines 43 from one another. This semiconductor wafer 41 is cut by cutting the scribe lines 43 away therefrom after predetermined processing. Consequently, the IC chips 42 are separated from one another.

Each of the IC chips 42 has an inspection pad 44 connected to an internal circuit. This inspection pad 44 is used in an inspection step. To inspect an operation of the internal circuit of each of the IC chips, a predetermined voltage is applied to this inspection pad. Alternatively, a predetermined electric current is supplied to the internal circuit so as to detect a change in voltage of this inspection pad 44. Thus, it is inspected whether or not the internal circuit of the IC chip 42 properly operates. Additionally, a protection device for preventing electrostatic breakdown may be provided between the inspection pad 44 and the internal circuit so as to prevent electrostatic breakdown of the internal circuit from occurring owing to application of an unexpected voltage, which is caused by static electricity at such an inspection, to the inspection pad 44 and due to inflow of an overcurrent to the internal circuit.

The inspection pads 44 and the protection devices respectively provided therein are necessary only in the inspection step. Upon completion of the inspection step, the inspection pads 44 and the protection devices are not used. In recent years, there have been demands for reducing the size of the IC chip. However, because the inspection pad and the protection device occupy a certain area when provided in the IC chip, it is difficult to reduce the size of the IC chip. Consequently, there have been problems in that the maximum number of IC chips, which can be formed on a semiconductor wafer, is limited to a relatively small value and that production efficiency is not increased.

SUMMARY OF THE INVENTION

The invention is accomplished in view of the aforementioned problems. Accordingly, an object of the invention is to provide a semiconductor wafer that has inspection pads needed in an inspection step and that achieves reduction in size of IC chips.

In order to achieve the above object, according to the present invention, there is provided a semiconductor wafer, comprising:
  a wafer substrate;
  a plurality of IC chips mounted on the wafer substrate, each of the IC chips having an internal circuit;
  a plurality of scribe lines formed on the wafer substrate for separating the IC chips from one another; and
  a plurality of inspection pads formed on the scribe lines, each of the inspection pads being connected to the associated internal circuit via a conduction path for inspecting an operation of the associated IC chip.

The necessity for providing an inspection pad in each of the IC chips is eliminated by forming the inspection pads on the scribe lines. The inspection pads formed on the scribe lines are cut away together with the scribe lines from the semiconductor wafer in a cutting step. Thus, the reduction in size of IC chips is achieved. Consequently, the maximum number of IC chips, which can be formed on a semiconductor wafer, is increased. Moreover, the productivity in producing IC chips is increased.

Preferably, the semiconductor wafer further comprises a plurality of protection devices formed on the scribe lines, each of the protection devices being connected to the associated inspection pad and the associated internal circuit for preventing an overcurrent from being supplied to the internal circuit.

Each of the protection devices is implemented by, for example, a diode, whose anode is grounded. The provision of such a protection device prevents an overcurrent from flowing into the internal circuit of the associated IC chip. Thus, the internal circuit is prevented from being broken. The reduction in size of IC chips can be achieved by forming the protection devices together with the inspection pads on the scribe lines.

Preferably, the conduction path is made of polysilicon. Some semiconductor wafers have a drawback in that aluminum wirings may short-circuit wafer substrates in the cutting step. However, in the above configuration, such a problem can be eliminated.

According to the present invention, there is also provided a method of manufacturing a plurality of IC chips each having an internal circuit, comprising the steps of:
  providing a wafer substrate on which the IC chips and a plurality of inspection pads each connected to the associated internal circuit via a conduction path are mounted, the IC chips being separated from one another by a plurality of scribe lines, the inspection pads being formed on the scribe lines;
  inspecting an operation of each IC pad through the associated inspection pad; and
  cutting away the scribe lines after the inspection step.

Preferably, the manufacturing method further comprises the step of cutting a part of the conduction path after the inspection step is carried out and before the scribe lines are cut away.

BRIEF DESCRIPTION OF THE DRAWINGS

The above objects and advantages of the present invention will become more apparent by describing in detail preferred exemplary embodiments thereof with reference to the accompanying drawings, wherein like reference numerals designate like or corresponding parts throughout the several views, and wherein.

DETAILED DESCRIPTION OF THE PREFERRED EMBODIMENTS

Hereinafter, a semiconductor wafer according to the invention is described in detail with reference to the accompanying drawings.

Figure 1A:
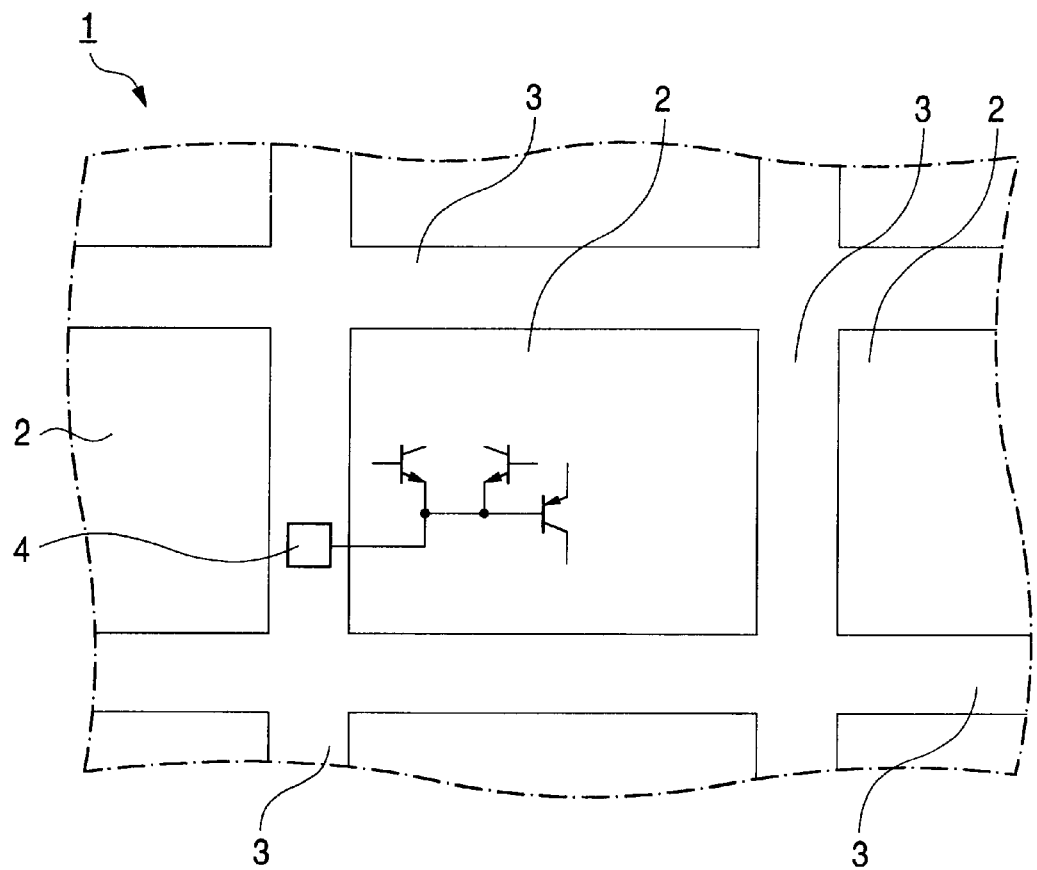
FIG. 1A is a partial plan view illustrating a semiconductor wafer according to a first embodiment of the invention.
Figure 1B:
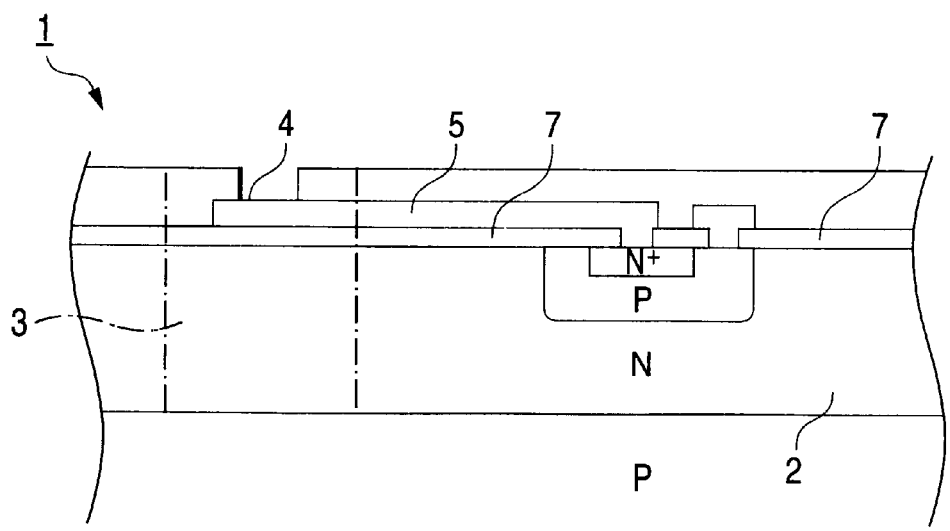
FIG. 1B is a sectional view illustrating an essential part of the semiconductor wafer shown in FIG. 1A.

In a semiconductor wafer according to a first embodiment as shown in FIGS. 1A and 1B, a plurality of IC chips 2 having the same configurations are formed while being isolated by scribe lines 3. These IC chips 2 are separated from one another by cutting the scribe lines 3 upon completion of a predetermined processing.

Further, the inspection pads 4 are formed on the scribe lines 3. Moreover, as illustrated in FIG. 1B, each of the inspection pads 4 is exposed from the surface of the corresponding scribe line 3, and electrically connected to the emitter of an NPN-transistor of the associated IC chip 2 through an aluminum layer 5 formed on a silicon dioxide layer 7.

Each of the inspection pads 4 is used for inspecting an operation of the associated IC chip 2 formed on the semiconductor wafer 1. That is, at an inspection, a predetermined voltage is applied to each of the inspection pads 4. Alternatively, an electric current is fed to each of the IC chips 2, and a change in voltage at each of the inspection pads 4 is detected. Thus, it is decided whether or not the IC chips 2 normally operate. After this inspection step, the scribe lines 3 are cut away from the semiconductor wafer 1. Consequently, the plural IC chips 2 are separated from one another. The inspection pads 4, which are unnecessary after the inspection step, are cut away therefrom together with the scribe lines 3 in a cutting step.

The provision of the inspection pads 4 on the scribe lines 3 in such a manner enables the formation of the IC chips 2 to be performed so that the area of each of the IC chips 2 is reduced by the area of the inspection pad 4. Thus, a larger number of IC chips 2 can be produced from the single semiconductor wafer 1. Consequently, according to the invention, production efficiency in producing IC chips is enhanced.

Figure 2A:
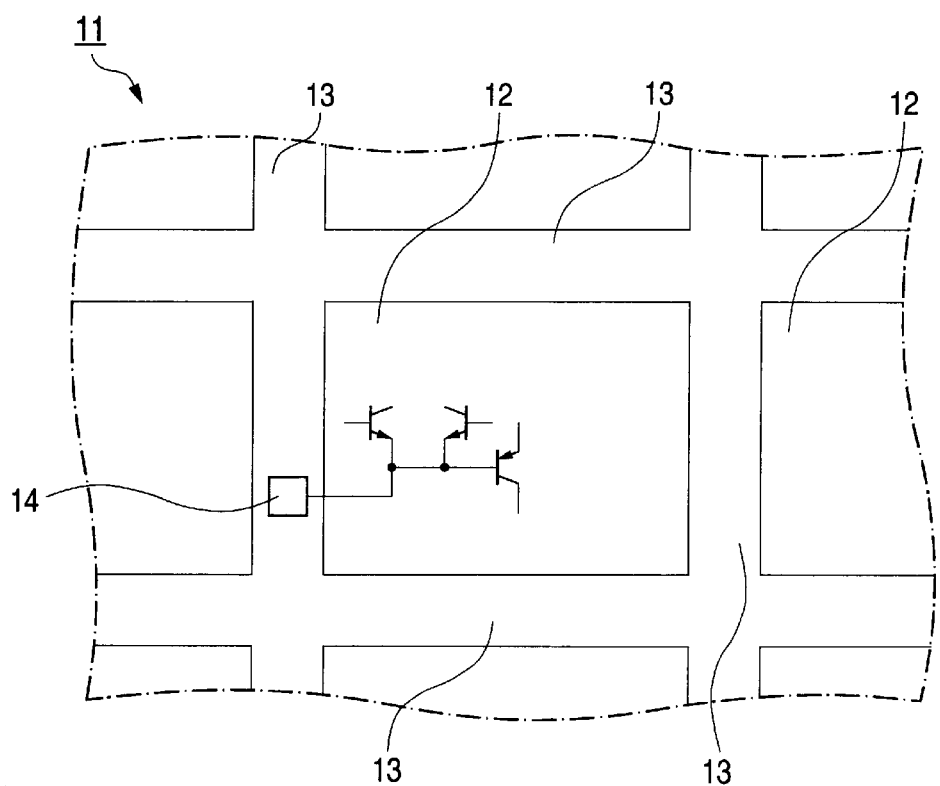
FIG. 2A is a plan view illustrating a part of a semiconductor wafer according to a second embodiment of the invention.
Figure 2B:
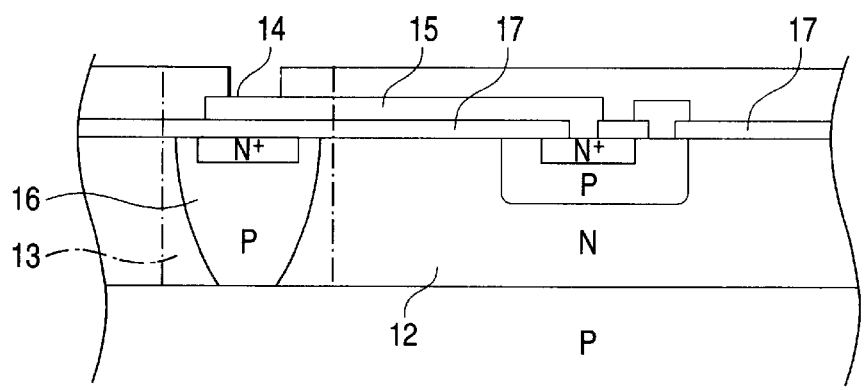
FIG. 2B is a sectional view illustrating an essential part of the semiconductor wafer shown in FIG. 2A.
Figure 2C:
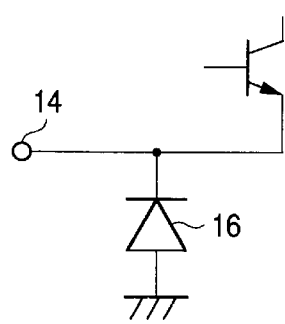
FIG. 2C is a circuit view illustrating an equivalent circuit of the semiconductor wafer shown in FIG. 2A.

FIGS. 2A to 2C illustrate a semiconductor wafer according to a second embodiment of the invention. In this second embodiment, a plurality of IC chips 12 isolated by scribe lines 13 are formed on a semiconductor wafer 11. Similarly as in the case of the embodiment shown in FIGS. 1A and 1B, inspection pads 4 are formed on the scribe lines 13. Moreover, the second embodiment has protection devices 16, each of which is provided between the corresponding inspection pad 14 and the internal circuit of the associated IC chip 12.

As is seen from FIGS. 2A and 2B, each of the protection devices 16 is formed on the corresponding scribe line 13. Further, as shown in FIG. 2B, each of the protection devices 16 is a diode consisting of an N+ diffusion layer and a P diffusion layer. FIG. 2C shows an equivalent circuit of a protection circuit employing this protection device 16. Each of the inspection pads 14 is connected to the emitter of an NPN transistor of the corresponding internal circuit through an aluminum layer 15 formed on a silicon dioxide layer 17. Each of the inspection pads 14 is also connected to a diode having a grounded anode terminal, that is, to a cathode terminal of the protection device 16. Thus, each electrostatic breakdown preventing circuit is configured in such a way as to prevent the corresponding internal circuit from being broken by an overcurrent in the case that an unexpected voltage is applied to the corresponding inspection pad owing to static electricity when the IC chips are inspected.

The inspection pads 14 and the protection devices 16 become unnecessary after the inspection of the IC chips 12 is finished. Thus, no problem is presented when the inspection pads 14 and the protection devices 16 are cut away together with the scribe lines 13 from the semiconductor wafer 11. Consequently, the provision of the inspection pads 14 and the protection devices 16 on the scribe lines 13 eliminates the necessity for providing the inspection pads 14 and the protection devices 16 in the IC chips 12. This enables the reduction in size of the IC chips 12, so that a larger number of IC chips 12 can be formed on a single semiconductor wafer 11.

Figure 3:
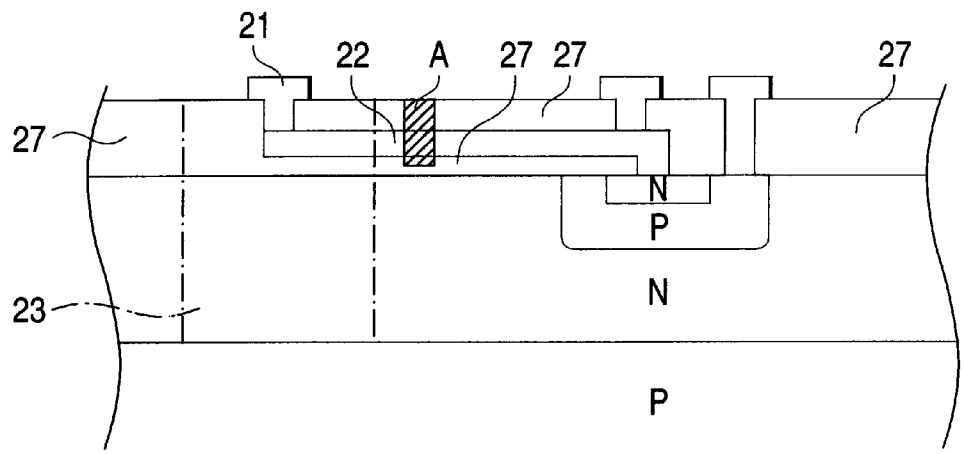
FIG. 3 is a sectional view illustrating a part of a semiconductor wafer according to a third embodiment of the invention.
Figure 4:
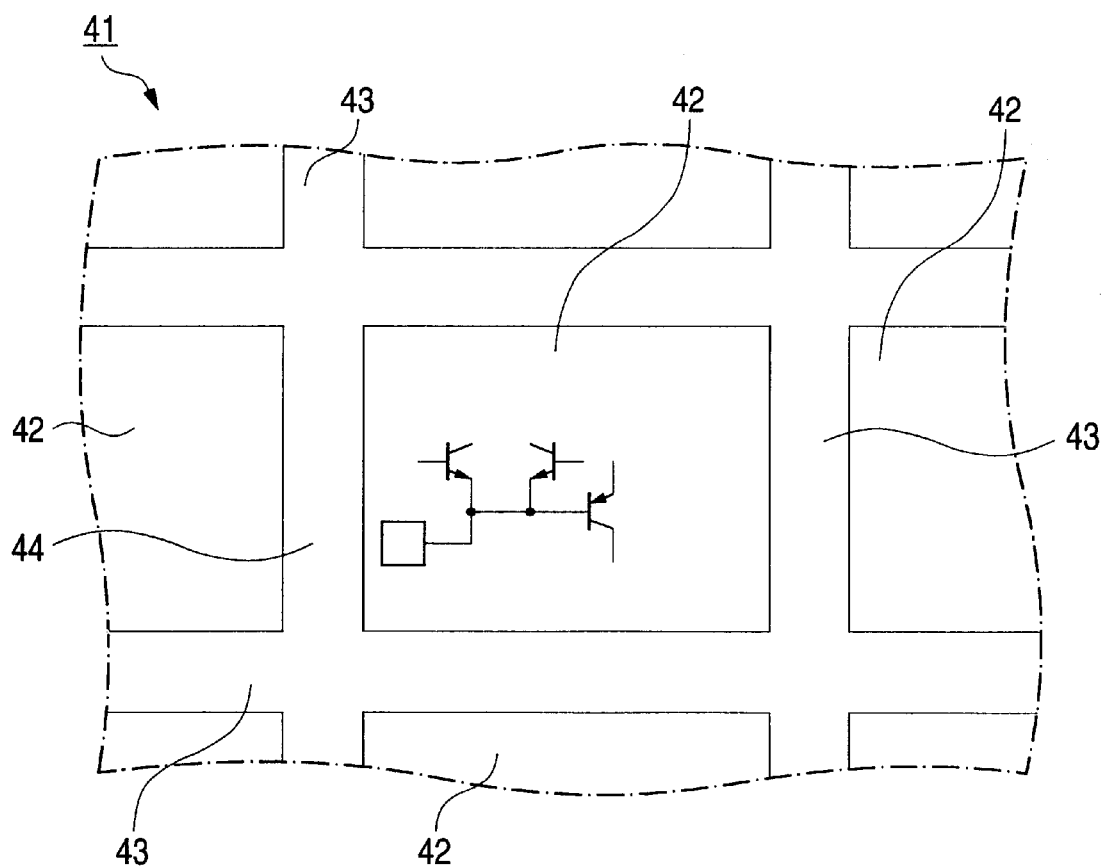
FIG. 4 is a partial plan view of a related semiconductor wafer.

FIG. 3 illustrates a semiconductor wafer according to a third embodiment of the invention. In the first and the second embodiments, each of the inspection pads 4 and 14 is connected to the internal circuit of a corresponding one of the IC chips 2 and 12 through an associated one of aluminum layers 5 and 15. In the case of the embodiments of such configurations, there is a fear that the aluminum layers 5 and 15, which are exposed to the outside when the scribe lines 3 and 13 are cut away, short-circuit wafer substrates. In this third embodiment, inspection pads 21 are formed as aluminum terminals. Moreover, each of the inspection pads 21 is connected to a corresponding one of the internal circuits through an electrically conductive polysilicon layer 22 formed between silicon dioxide layers 27. This reduces the possibility that the connecting layers short-circuit the wafer substrates when scribe lines 23 are cut away from the wafer. Consequently, more highly reliable IC chips are provided.

Incidentally, the possibility of short circuits between the internal circuit and the wafer substrate is eliminated by cutting a hatched part A of the polysilicon layer 22, which connects the internal circuit to the wafer substrate, by using laser light upon completion of the inspection. Thus, more highly reliable IC chips are provided. In the case of cutting the polysilicon layer 22 by using laser light, more highly reliable IC chips are provided by cutting similar parts of the aluminum layers 5 and 15 respectively shown in FIGS. 1B and 2B.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A semiconductor wafer, comprising:
   a wafer substrate;
   a plurality of IC chips mounted on the wafer substrate, each of the IC chips having an internal circuit;
   a plurality of scribe lines formed on the wafer substrate for separating the IC chips from one another; and
   a plurality of inspection pads formed on the scribe lines, each of the inspection pads being connected to the associated internal circuit via a conduction path for inspecting an operation of the associated IC chip,
   wherein the conduction path is formed in the wafer substrate.

2. The semiconductor wafer as set forth in claim 1, further comprising a plurality of protection devices formed on the scribe lines, each of the protection devices being connected to the associated inspection pad and the associated internal circuit for preventing an overcurrent from being supplied to the internal circuit.

3. The semiconductor wafer as set forth in claim 1, wherein the conduction path is made of polysilicon.

4. A semiconductor wafer as set forth in claim 2, wherein said protection devices formed on said scribe lines comprise one or more diffusions which extend within said semiconductor wafer.

5. A semiconductor wafer as set forth in claim 4, wherein said protection devices are in the form of diodes comprising an N diffusion layer and a P diffusion layer.

6. A semiconductor wafer as set forth in claim 2 wherein said inspection pads are connected to an emitter of a transistor of said internal circuit of said plurality of IC chips.

7. A semiconductor wafer as set forth in claim 6 wherein said protection devices are diodes, and wherein said inspection pads are also connected to cathode terminals of said diodes.

8. A semiconductor wafer as set forth in claim 3 wherein said conduction path which connects said internal circuit to inspection pads on said wafer substrate includes a sacrificial portion that is located within a boundary of said IC chip.

9. A semiconductor wafer as set forth in claim 1, wherein the plurality of inspection pads are formed in the scribe lines situated between the IC chips.

10. A semiconductor wafer as set forth in claim 2, wherein the plurality of protection devices are buried in the wafer substrate under the scribe lines.

* * * * *